(12) United States Patent
Frank

(10) Patent No.: US 7,493,089 B2
(45) Date of Patent: Feb. 17, 2009

(54) CALIBRATING A COMMUNICATION LINK USING FREQUENCY RAMPS

(75) Inventor: Michael L. Frank, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 687 days.

(21) Appl. No.: 11/231,910

(22) Filed: Sep. 21, 2005

(65) Prior Publication Data

US 2007/0066236 A1    Mar. 22, 2007

(51) Int. Cl.
*H04B 11/00* (2006.01)
*H04Q 7/20* (2006.01)

(52) U.S. Cl. .................. 455/67.11; 455/69; 455/423

(58) Field of Classification Search .......... 455/67.11, 455/69, 115.1, 115.2, 226.1, 226.2, 307, 455/339, 423, 522

See application file for complete search history.

(56) References Cited

U.S. PATENT DOCUMENTS

| 5,397,988 | A | 3/1995 | Schmalbein et al. |
| 6,820,234 | B2 * | 11/2004 | Deas et al. ................ 714/814 |
| 7,278,069 | B2 * | 10/2007 | Abrosimov et al. ......... 714/700 |

FOREIGN PATENT DOCUMENTS

GB    1 492 862    9/1975

OTHER PUBLICATIONS

GB Search Report for Patent Application in Great Britain Application No. 0618640.7 dated Jan. 15, 2007.

* cited by examiner

*Primary Examiner*—Quochien B Vuong

(57) ABSTRACT

A method for calibrating a communication link that uses frequency ramps to locate the frequency response of a receiver. A method for calibrating according to the present teachings includes generating a transmit signal that includes a series of frequency ramps and determining a timing of gain peaks in a receiver in response to the frequency ramps in the transmit signal. The timing of gain peaks in the receiver indicates the frequency response of the receiver and is used to determine an adjustment to the transmit signal so that the transmit signal adapts to the frequency response of the receiver.

18 Claims, 3 Drawing Sheets

```
┌─────────────────────────────┐
│   Generate a Transmit       │
│ Signal Having a Series of   │
│     Frequency Ramps         │
│            10               │
└─────────────┬───────────────┘
              │
              ▼
┌─────────────────────────────┐
│  Determine a Timing of Gain │
│ Peaks in a Receiver in Response│
│    to the Frequency Ramps   │
│            12               │
└─────────────┬───────────────┘
              │
              ▼
┌─────────────────────────────┐
│   Determine a Transmitter   │
│ Frequency Adjustment in Response│
│  to the Timing of Gain Peaks│
│            14               │
└─────────────────────────────┘
```

FIG. 1

CALIBRATING A COMMUNICATION LINK USING FREQUENCY RAMPS

BACKGROUND

A transmitter and a receiver may be used to form a communication link. For example, a transmitter may generate a transmit signal that carries information to be communicated via the communication link and a receiver may receive the transmit signal and recover the information from the transmit signal. One example of a communication link is an over-the-air radio frequency (RF) communication link.

A transmitter and a receiver may be adapted for communication using a predetermined range of frequencies on a communication link. A predetermined range of frequencies on a communication link may be referred to as a frequency band. A transmitter may generate a transmit signal having a frequency that lies within the frequency band of the communication link. A receiver may include an input filter that excludes signals that lie outside of the frequency band of the communication link.

The frequency response of a receiver may drift in response to changes in temperature. For example, the pass band of an input filter of a receiver may drift in response to changes in temperature. In addition, manufacturing variation in filter components may cause variations in the frequency response of different receivers. Unfortunately, variations in frequency response may cause communication failures if an input filter for a receiver rejects a transmit signal that lies within the frequency band of the communication link.

SUMMARY OF THE INVENTION

A method for calibrating a communication link is disclosed that uses frequency ramps to locate the frequency response of a receiver. A method for calibrating a communication link according to the present teachings includes generating a transmit signal that includes a series of frequency ramps and determining a timing of gain peaks in a receiver in response to the frequency ramps in the transmit signal. The timing of gain peaks in the receiver indicates the frequency response of the receiver and is used to determine an adjustment to the transmit signal so that the transmit signal adapts to the frequency response of the receiver.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 1 shows a method for calibrating a communication link according to the present techniques;

DETAILED DESCRIPTION

FIG. 1 shows a method for calibrating a communication link according to the present techniques. The method shown may be used to calibrate a transmitter to a frequency response of a receiver.

At step 10, a transmit signal having a series of frequency ramps is generated. The range of frequencies encompassed by the frequency ramps may be pre-selected in response to a frequency range that a pass band of a receiver is likely to be located. For example, it may be known that the pass band of a receiver may drift within a band of uncertainty and the range of frequencies in the frequency ramps may encompass the band of uncertainty.

At step 12, a timing of gain peaks in a receiver in response to the frequency ramps is determined. The timing of gain peaks indicates a relative position of the pass band of a receiver in relation to the frequency ramps. For example, the timing of gain peaks may indicate that the pass band of a receiver is at a relatively low frequency encompassed the frequency ramps or at a relatively high frequency encompassed by the frequency ramps or somewhere in between.

At step 14, a transmitter frequency adjustment is determined in response to the timing of gain peaks. The transmitter frequency adjustment may be used to adjust the range of frequencies encompassed by the frequency ramps so that the pass band of the receiver is at a relative mid-point frequency in the range of frequencies encompassed by the frequency ramps. For example, the frequency ramps in the transmit signal may be shifted up or down in frequency in response to the timing of gain peaks from step 12.

Figure 2:
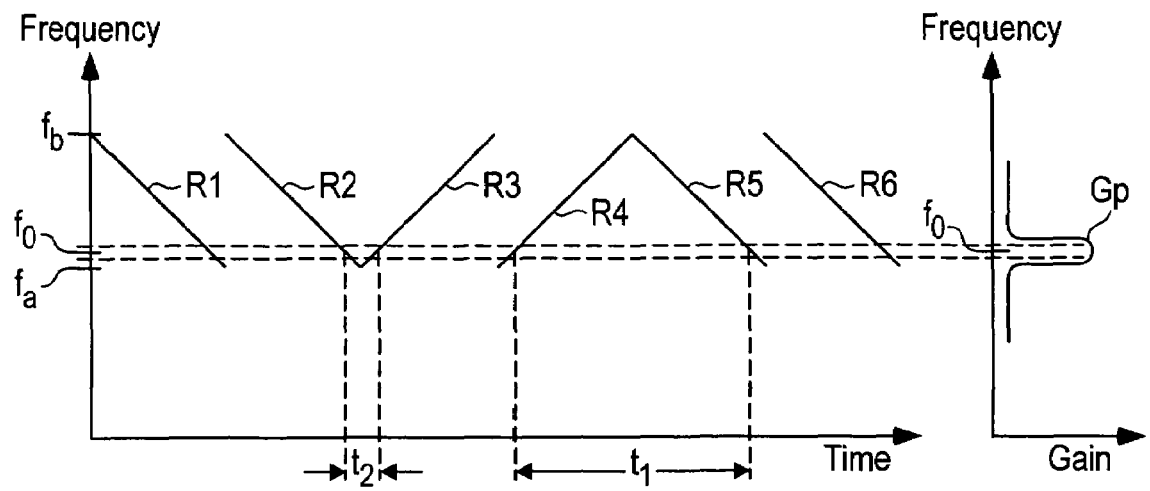
FIGS. 2-4 illustrate examples of the timing of gain peaks in a receiver in response to a series of rising and falling frequency ramps in a transmit signal.

FIG. 2 illustrates an example timing of gain peaks in a receiver in response to a series of rising and falling frequency ramps in a transmit signal. The transmit signal in this example includes a falling frequency ramp R1, followed by a falling frequency ramp R2, followed by a rising frequency ramp R3 and a rising frequency ramp R4, followed by falling frequency ramps R5 and R6. The range of frequencies encompassed by the frequency ramps R1-R6 is between a low frequency fa and high frequency fb.

The peak gain $G_p$ of the receiver in response to the frequency ramps R1-R6 is at a frequency of f0 which is the center frequency of the pass band of the receiver. The frequency f0 is near the low frequency end of the range of frequencies in the frequency ramps R1-R6.

The relative position of the pass band of the receiver in relation to the frequency ramps R1-R6 is indicated by asymmetries in the timing of the gain peaks in the receiver in response to the frequency ramps R1-R6 having complementary rising/falling and falling/rising patterns. For example, the time between a gain peak in the receiver in response to the frequency ramp R4 and a gain peak in the receiver in response to the frequency ramp R5 is t1 while the time between a gain peak in the receiver in response to the frequency ramp R2 and a gain peak in the receiver in response to the frequency ramp R3 is t2. The fact that t1 is greater than t2 indicates that the center frequency f0 of the pass band of the receiver is relatively low in the range fa-fb of the frequency ramps R1-R6.

Figure 3:
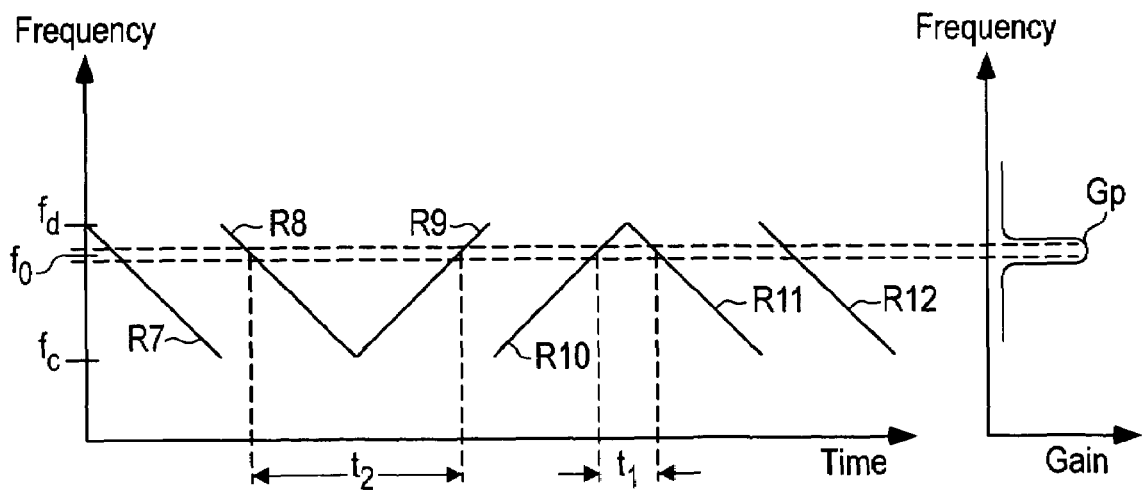

FIG. 3 illustrates an example timing of gain peaks in a receiver in response to a series of rising and falling frequency ramps R7-R12 in a transmit signal. The range of frequencies encompassed by the frequency ramps R7-R12 is between fc and fd. The center frequency f0 of the pass band of the receiver is near the high frequency end of the frequency ramps R7-R12. The time between a gain peak in the receiver in response to the frequency ramp R10 and a gain peak in the receiver in response to the frequency ramp R11 (t1) and the time between a gain peak in the receiver in response to the frequency ramp R8 and a gain peak in the receiver in response to the frequency ramp R9 (t2) is such that t1 is less than t2. The fact that t1 is less than t2 indicates that the center frequency f0 of the pass band of the receiver is relatively high in the range fc-fd of the frequency ramps R7-R12.

Figure 4:
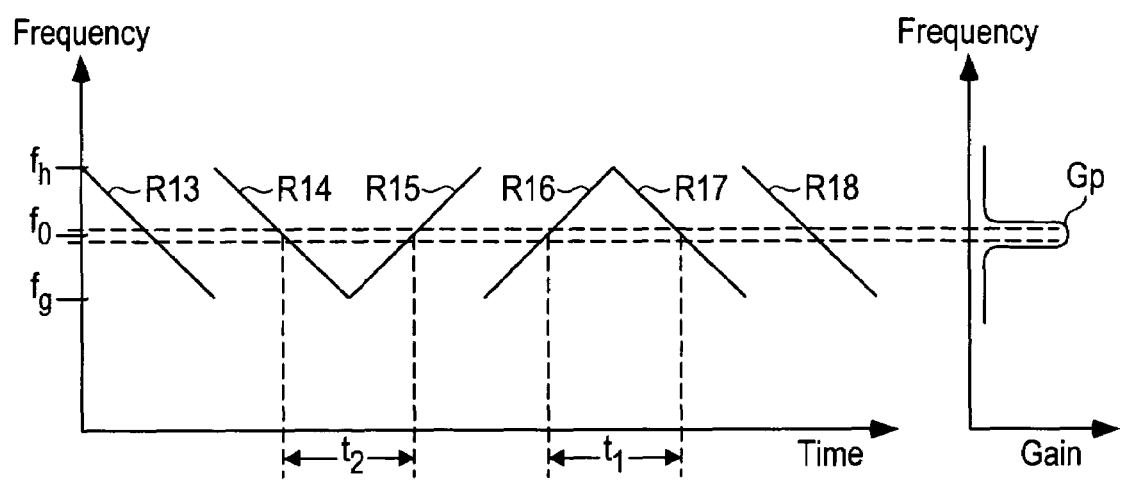

FIG. 4 illustrates another example timing of gain peaks in a receiver in response to a series of rising and falling frequency ramps R13-R18 in a transmit signal. The range of frequencies encompassed by the frequency ramps R13-R18 is between fg and fh. The center frequency f0 of the pass band of the receiver is near the center frequency of the frequency ramps R13-R18. The time between a gain peak in the receiver in response to the frequency ramp R16 and a gain peak in the receiver in response to the frequency ramp R17 (t1) and the time between a gain peak in the receiver in response to the frequency ramp R14 and a gain peak in the receiver in response to the frequency ramp R15 (t2) is such that t1 is substantially equal to t2. The fact that t1 is substantially equal to t2 indicates that the center frequency f0 of the pass band of the receiver is near the center frequency in the range fg-fh of the frequency ramps R13-R18.

Figure 5:
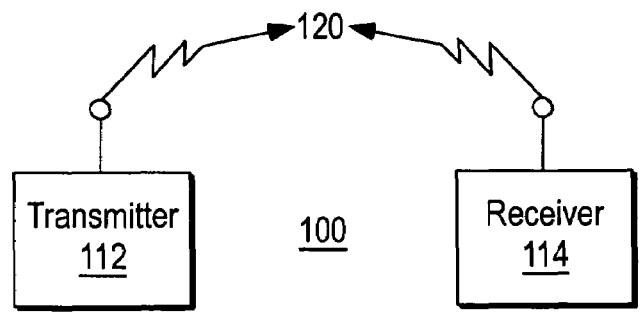
FIG. 5 shows a communication system that incorporates the present teachings.

FIG. 5 shows a communication system 100 that incorporates the present teachings. The communication system 100 includes a transmitter 112 and a receiver 114. The transmitter 112 generates a transmits signal 120 that includes a series of frequency ramps. In one embodiment, information is encoded in the transmit signal 120 using frequency ramps. For example, a falling frequency ramp may indicate a "0" of information and a rising frequency ramp may indicate a "1" of information or visa versa.

The receiver 114 includes circuitry for measuring the timing of its gain peaks in response to the frequency ramps in the transmit signal 120 in the manner illustrated above. In one embodiment, the receiver 114 calculates the t1 and t2 values as shown above and uses the t1 and t2 values to determine whether the transmit signal should be shifted up (t2>t1) or down (t1>t2) or should remain the same (t1=t2). The receiver 114 determines transmitter frequency adjustments in response to the timing of gain peaks and communicates the transmitter frequency adjustments to the transmitter 112. For example, the receiver 114 may send a command to the transmitter 112 to cause it to increase its frequency or a command to decrease its frequency. The transmitter 112 increases its frequency by shifting the frequency ramps in the transmit signal 120 up in frequency. The transmitter 112 decreases its frequency by shifting the frequency ramps in the transmit signal 120 down in frequency.

In another embodiment, the receiver 114 communicates the raw timing of gain peaks to the transmitter 112 and the transmitter 112 determines the transmitter frequency adjustments.

The receiver 114 may communicate the timing of the gain peaks or the transmitter frequency adjustment commands to the transmitter 112 via the frequency band used to carry the transmit signal 120 or via another communication channel between the transmitter 112 and the receiver 114.

The frequency ramps in the transmit signal 120 may be continuous frequency ramps and amplitude modulation may be used to provide a clock for measuring the timing of gain peaks in the receiver 114. Alternatively, the frequency ramps in the transmit signal 120 may be stepped ramps in which the frequency between the steps provides a reference so that the timing between gain peaks is in units of steps.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method for calibrating a communication system, comprising:
   generating a transmit signal including a series of frequency ramps;
   determining a timing of gain peaks in a receiver in response to the frequency ramps in the transmit signal;
   determining an adjustment to the transmit signal in response to the timing of gain peaks.

2. The method of claim 1, wherein generating a transmit signal includes generating a series of continuous frequency ramps.

3. The method of claim 1, wherein generating a transmit signal includes generating a series of stepped frequency ramps.

4. The method of claim 1, wherein generating a transmit signal includes generating a series of frequency ramps having a range of frequencies that encompass a band of uncertainty in a pass band of the receiver.

5. The method of claim 1, wherein determining an adjustment includes determining an asymmetry in the timing of gain peaks.

6. The method of claim 1, wherein determining a timing of gain peaks comprises;
   determining a time between a gain peak for a first rising frequency ramp and a gain peak for a first falling frequency ramp;
   determining a time between a gain peak for a second falling frequency ramp and a gain peak for a second rising frequency ramp.

7. The method of claim 6, wherein determining an adjustment includes determining a difference between the times.

8. The method of claim 1, wherein determining an adjustment includes determining a frequency shift in the transmit signal.

9. A communication system, comprising:
   transmitter that generates a transmit signal including a series of frequency ramps;
   receiver that reaches a series of gain peaks in response to the frequency ramps such that an adjustment to the transmit signal is indicated by a timing of gain peaks.

10. The communication system of claim 9, wherein the receiver determines the adjustment to the transmit signal in response to the timing.

11. The communication system of claim 9, wherein the transmitter determines the adjustment to the transmit signal in response to the timing.

12. The communication system of claim 9, wherein the transmit signal includes a series of continuous frequency ramps.

13. The communication system of claim 9, wherein the transmit signal includes a series of stepped frequency ramps.

14. The communication system of claim 9, wherein the transmit signal includes a series of frequency ramps having a range of frequencies that encompass a band of uncertainty in a pass band of the receiver.

15. The communication system of claim 9, wherein the adjustment is determined by determining an asymmetry in the timing of gain peaks.

16. The communication system of claim 9, wherein the timing of gain peaks includes a time between a gain peak for a first rising frequency ramp and a gain peak for a first falling frequency ramp and a time between a gain peak for a second falling frequency ramp and a gain peak for a second rising frequency ramp.

17. The communication system of claim 16, wherein the adjustment is determined by determining a difference between the times.

18. The communication system of claim 9, wherein the adjustment is determined by determining a frequency shift in the transmit signal.

* * * * *